(12) United States Patent
Elias et al.

(10) Patent No.: US 8,520,884 B2
(45) Date of Patent: Aug. 27, 2013

(54) AUDIO/VIDEO DEVICE

(75) Inventors: Aleix Ingles Elias, London (GB); Hiroaki Yokota, Tokyo (JP)

(73) Assignee: Sony Corporation, Tokyo (JP)

(*) Notice: Subject to any disclaimer, the term of this patent is extended or adjusted under 35 U.S.C. 154(b) by 275 days.

(21) Appl. No.: 12/984,799

(22) Filed: Jan. 5, 2011

(65) Prior Publication Data

US 2011/0216934 A1    Sep. 8, 2011

(30) Foreign Application Priority Data

Mar. 2, 2010  (GB) .................................. 1003484.1

(51) Int. Cl.
*H04R 1/02* (2006.01)
(52) U.S. Cl.
USPC .......................................... 381/395; 381/394
(58) Field of Classification Search
USPC ................. 381/394, 395; 181/148, 149, 150, 181/153; G9B/23, 23.014, 23.015
See application file for complete search history.

(56) References Cited

FOREIGN PATENT DOCUMENTS

| GB | 2 434 926 A | 8/2007 |
| JP | 2002-158460 | 5/2002 |
| JP | 2008047799 | * 2/2008 |

* cited by examiner

*Primary Examiner* — Brian Ensey
(74) *Attorney, Agent, or Firm* — Oblon, Spivak, McClelland, Maier & Neustadt, L.L.P.

(57) ABSTRACT

An audio/video device including a plurality of walls together forming a case, wherein one wall of the plurality of walls includes an inner peripheral edge. A surface extends from the inner peripheral edge inwardly of the case and defines an open-sided outwardly facing cavity. At least one item of connection is located within the cavity. A tongue is provided having a base and an outer peripheral edge. The inner peripheral edge of the one wall is divided into a first portion and a second portion. At the base, the tongue joins with the first portion of the inner peripheral edge of the one wall. The tongue extends substantially parallel with the one wall from the base to the outer peripheral edge so as to partially close the cavity and define a gap around the tongue, the gap extending between the outer peripheral edge of the tongue and the second portion of the inner peripheral edge of the one wall.

20 Claims, 9 Drawing Sheets

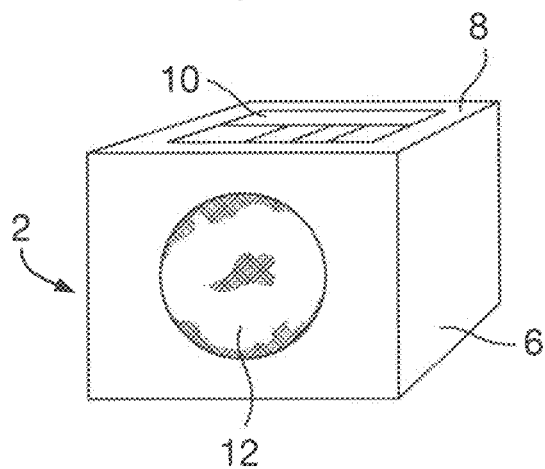
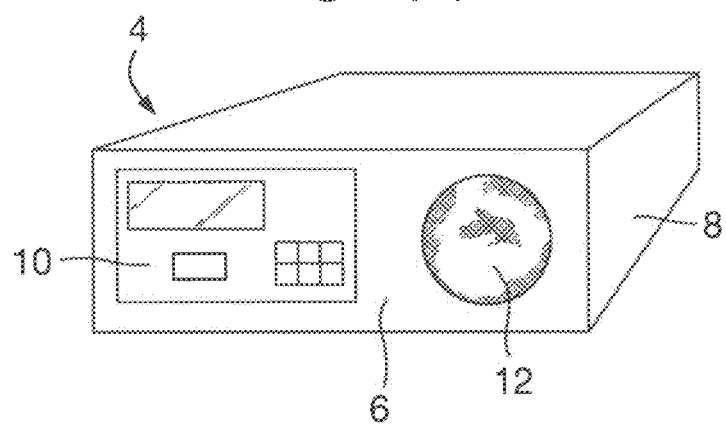

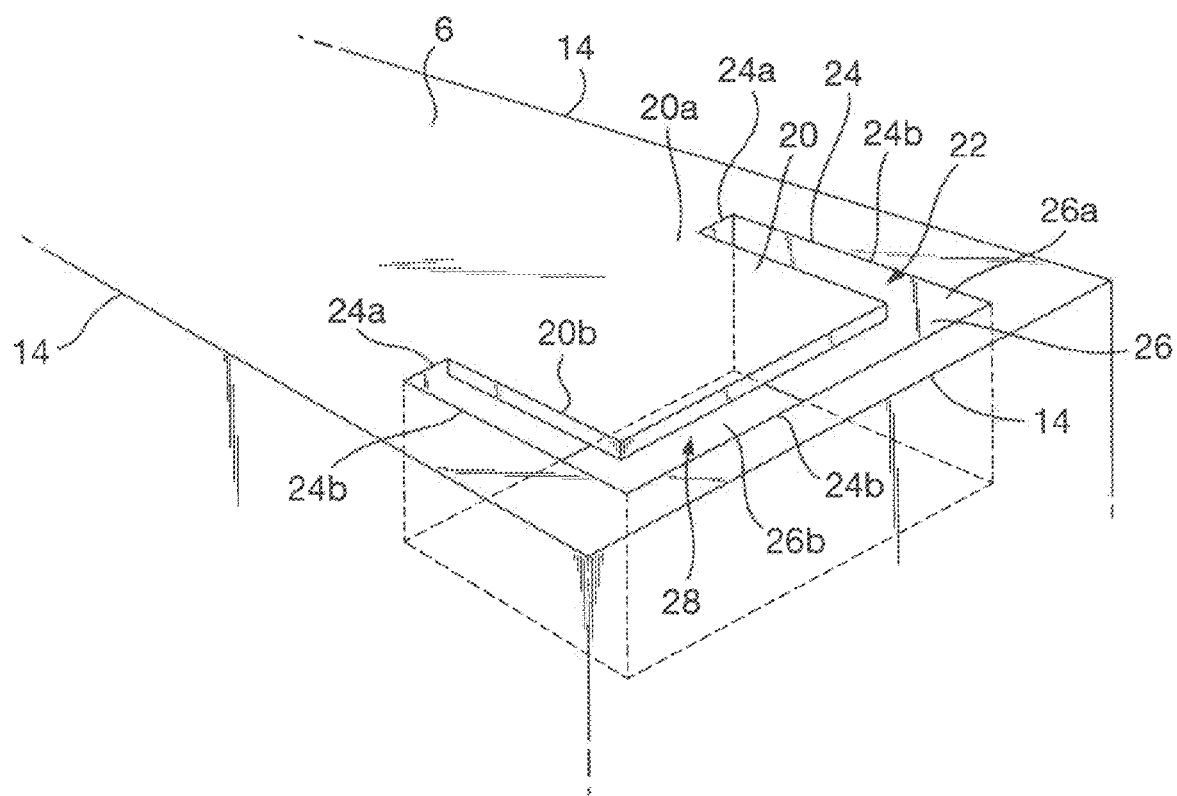

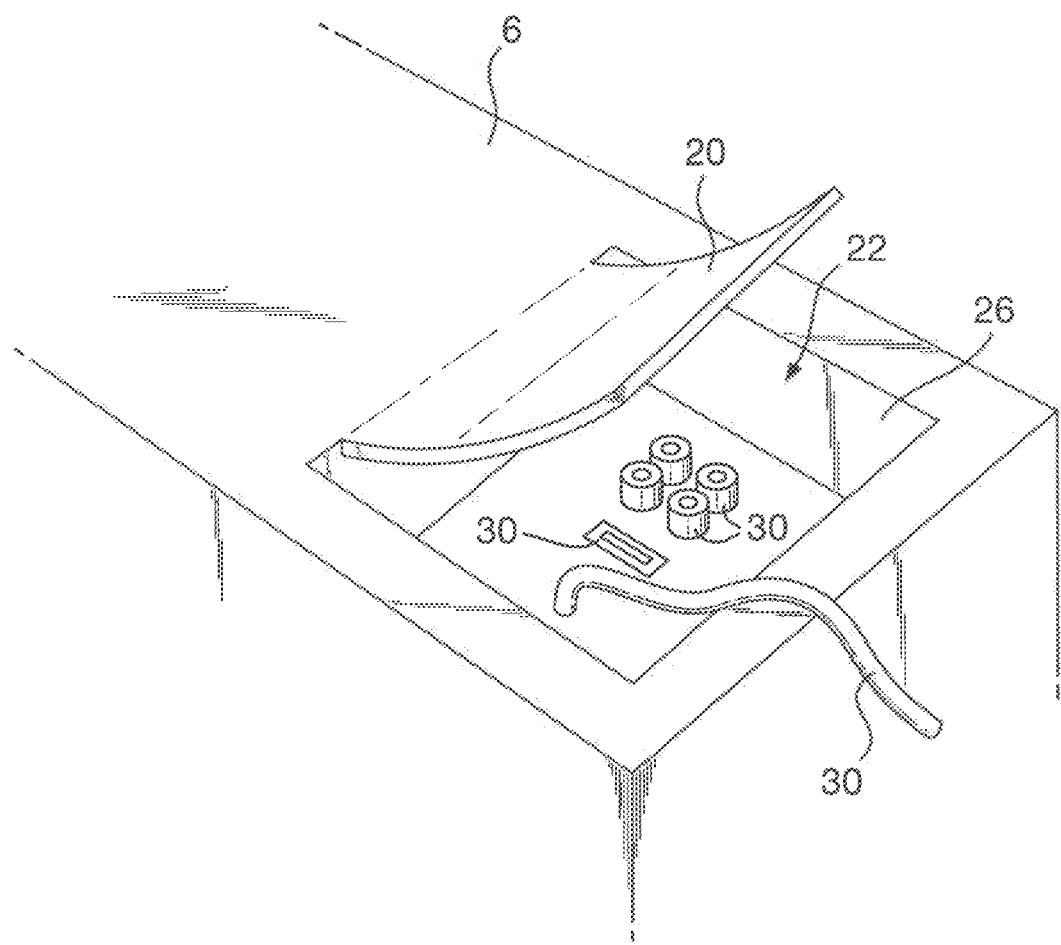

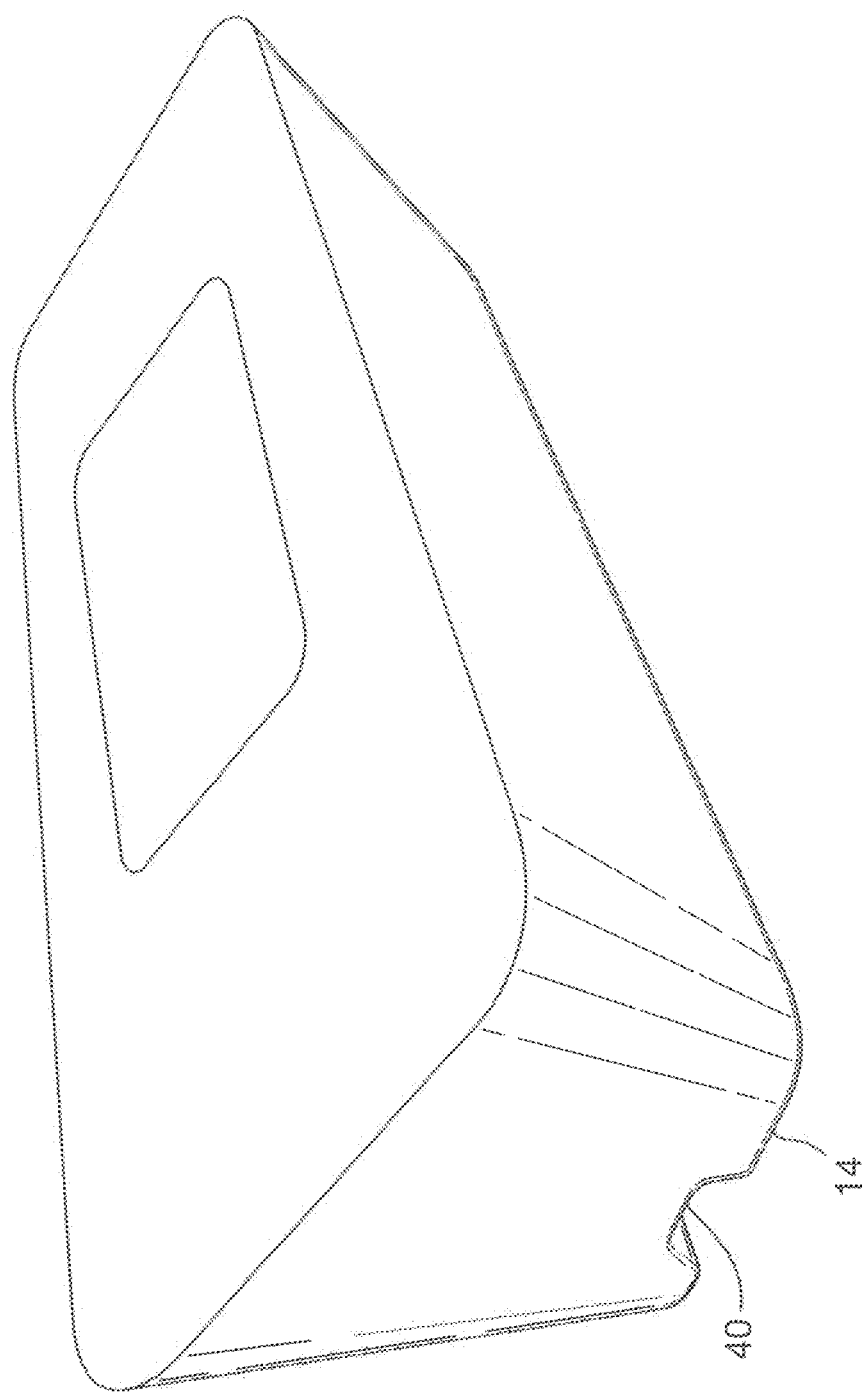

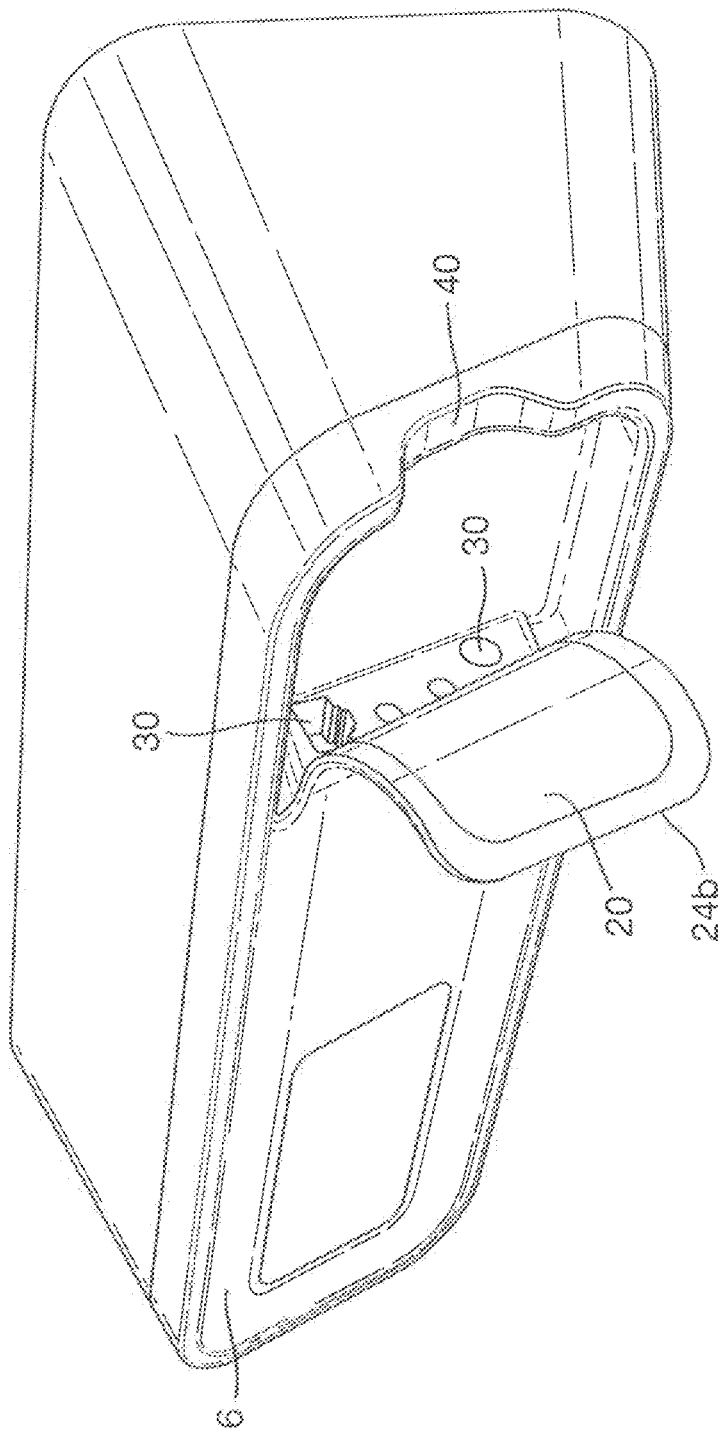

AUDIO/VIDEO DEVICE

CROSS-REFERENCE TO RELATED APPLICATIONS

This application is based upon and claims the benefit of priority from British Application No. 1003484.1 filed 2 Mar. 2010, the entire contents of which are incorporated by reference.

BACKGROUND OF THE INVENTION

1. Field of the Invention

The present application relates to an audio/video device, in particular having a cavity for housing at least one item of connection, and a corresponding method for housing items of connection.

2. Description of the Related Art

A wide variety of audio and video devices are well known having various items for connecting those devices. For example, electrical and optical audio connectors may be provided, network and bus connectors may be provided and power connectors may be provided. These connectors may take the form of sockets or cables which extend outwardly from inside the case of the device.

OBJECTS AND SUMMARY OF THE INVENTION

The items of connection may be considered to be unsightly and may interfere with use of the device, for instance catching on things in the environment surrounding the device, particularly during transport of that device. Also, such items of connection may interfere with correct positioning of the device on a surface on which the device to be stood or against a surface against which the device is to be mounted.

Audio/video devices are known in which a wall of the case is recessed and various sockets are provided within that recess. Although this prevents features of the sockets from catching on things in the environment surrounding the device, there is still a problem of cables hanging loose from the recess.

Often connectors are provided for optional features and may not be used by a particular user. With these arrangements, a removable cover may be provided for the recess such that, when the connectors are not required by a user, the cover remains in place. There is then the disadvantage that, if a user does wish to use one of the connectors, the cover must be removed in order to allow one or more cables to access their respective sockets.

According to the present invention, there is provided a method of housing items of connection in an audio/video device having a plurality of walls together forming a case. The method includes forming an outwardly facing open-sided cavity in one wall of the plurality of walls, providing at least one item of connection within the cavity and partially closing the cavity with a tongue extending from a base at a peripheral edge of the cavity so as to define a gap around the tongue between the tongue and the peripheral edge.

According to the present invention, there is also provided a method of housing items of connection in an audio/video device having a plurality of walls, together forming a case. The method includes forming an inner peripheral edge in one wall of the plurality of walls and providing a surface extending from the inner peripheral edge inwardly of the case so as to form an open-sided outwardly facing cavity, providing at least one item of connection within the cavity and using a tongue to partially close the cavity by providing the tongue with a base and an outer peripheral edge, by joining the base with a first portion of the inner peripheral edge, the inner peripheral edge being divided into a first portion and a second portion, and by providing the tongue to extend parallel with the one wall from the base to the outer peripheral portion and to define a gap around the tongue, the gap extending between the outer peripheral edge of the tongue and the second portion of the inner peripheral edge of the one wall.

According to the present invention, there is provided an audio/video device including a plurality of walls together forming a case, wherein one wall of the plurality of walls includes an inner peripheral edge, a surface extending from the inner peripheral edge inwardly of the case and defining an open-sided outwardly facing cavity, at least one item of connection located within the cavity; and a tongue having a base and an outer peripheral edge, wherein the inner peripheral edge of the one wall is divided into a first portion and a second portion, wherein, at the base, the tongue joins with the first portion of the inner peripheral edge of the one wall, and wherein the tongue extends substantially parallel with the one wall from the base to the outer peripheral edge so as to partially close the cavity and define a gap around the tongue, the gap extending between the outer peripheral edge of the tongue and the second portion of the inner peripheral edge of the one wall.

The audio/video device may have audio functionality, video functionality or both.

In this way, items of connection are housed within the cavity and will not catch or snag on things in the environment surrounding the device. The tongue provides, with the one wall, a flush surface, which may be placed against any appropriate mounting surface as well as providing an aesthetically pleasing design. By virtue of the tongue and the defined gap, access is still provided to the items of connection within the cavity. In this way, if a user does require use of one or more of the items of connection, access is available to those items, without removing any part of the audio device. With the tongue in place, any appropriate cables may run to their respective items of connection through the defined gap.

The tongue may be movable away from and back towards the second portion of the inner peripheral edge of the one wall so as respectively to open and close the cavity.

In this way, when a user requires access to the items of connection, for instance to connect a respective cable, the tongue may be movable away from the inner peripheral edge of the one wall so as to open the cavity and provide easier access to the items of connection. Also, it may be desirable to store one or more cables which are either themselves items of connection or connected to such items of connection, within the cavity. Such cables may be arranged within the cavity and then the tongue moved back towards the inner peripheral edge of the one wall so as to close the cavity and keep the cables housed neatly within the device.

Any appropriate arrangement may be provided for allowing the tongue to move away from and back towards the inner peripheral edge of the one wall. For instance, the tongue may include a hinge joining the base to the inner peripheral edge of the one wall. Alternatively or additionally, the tongue may be flexible and may be able to flex by one of elastic and plastic deformation.

In this way, a user may be able to hinge or pivot the tongue away from the rest of the audio device so as to expose the cavity. Alternatively, or additionally, the tongue itself may be made of a material allowing it to flex. The tongue may be plastically flexed away from the cavity to gain access to the cavity and then once again plastically moved back to cover the cavity. Alternatively, the tongue may be made of an elastic material such that it is resiliently flexed away from the cavity. The tongue's resilience or elasticity will return the tongue to the closed position. This may be particularly effective when using the cavity to store cables.

The tongue and the cavity may be arranged so as together to define a space for storing at least one cable.

The at least one item of connection may include one or more of an electrical audio socket, an optical audio socket, an aerial socket, a network socket, a bus socket and a power socket. Similarly, the at least one item of connection may include at least one cable extending outwardly from inside the case. The cable may be an electrical cable or an optical cable and may be used for connection to an aerial, a network, a bus, a power source or other audio devices. Where the device additionally has video functions, appropriate video sockets and/or cables may also be provided.

Usually, the one wall of the plurality of wall meets another wall of the plurality of walls at a boundary. The one wall of the plurality of walls may include a concave surface extending from the second portion of the inner peripheral edge to the boundary so as to define a channel along which a cable can run from the another wall to the cavity.

In this way, the one wall of the plurality of walls may be placed against a mounting surface with its concave surface defining with that mounting surface a channel through which a cable may be run into the cavity.

A plurality of such concave surfaces may be provided in different orientations and optionally extending to different boundaries. In this way, access may be provided to the cavity in different directions.

The gap extending between the outer peripheral edge of the tongue and the second portion of the inner peripheral edge of the one wall may be arranged to support at least one cable extending therethrough. The cable may be one of the items of connection itself or merely a cable connected to such an item.

In this way, the user may choose to use items of connection without the need for removal of the tongue.

The width of the gap between the outer peripheral edge of the tongue and the second portion of the inner peripheral edge of the one wall may be chosen according to the particular requirements of the audio device and, in particular, the types of cable to be used with the audio device. Hence, the gap may be chosen to be at least one of 3 millimeters, 4 millimeters and 5 millimeters. To avoid the gap being unnecessarily large, it is preferably less than one of 10 millimeters, 9 millimeters and 8 millimeters.

The inner peripheral edge of the one wall may be substantially quadrilateral in shape. Alternatively, the inner peripheral edge of the one wall may be substantially circular in shape. Similarly, but independently, the tongue may be substantially quadrilateral in shape or substantially circular in shape. Where the inner peripheral edge of the one wall and the tongue have a corresponding shape, an even gap may be provided between them.

The gap, the outer peripheral edge of the tongue and the second portion of the inner peripheral edge of the one wall may together follow respective parts which traverse one of at least 90 degrees, at least 180 degrees, at least 270 degrees and at least 360 degrees.

By increasing the directions along which the path of the gap follow, the directions by which the cavity can be accessed increase.

The device may include, inside the case, components for reproducing audio information. The device may include, inside the case, components for reproducing video information. The components may include software or hardware components. They may include components merely for converting audio signals from one form to another and/or may include components, such as a loudspeaker, for producing a sound wave.

The device may include a user interface on one of the plurality of walls. The user interface may be provided on a wall opposite said one wall.

The device may be configured as an interne radio. Similarly, it may be configured in many other forms, such as a traditional radio, a CD player, a cassette player, a MiniDisc player, etc. The device may operate as a wireless "slave" speaker for a master (hi-fi) device.

BRIEF DESCRIPTION OF THE DRAWINGS

FIGS. 1(a) and (b) illustrate schematically examples of devices embodying the present invention;

FIG. 2 illustrates schematically a wall of a device embodying the present invention;

FIG. 3 illustrates the wall of FIG. 2 with the tongue moved away from the cavity;

DETAILED DESCRIPTION OF THE PREFERRED EMBODIMENTS

Figure 4A:
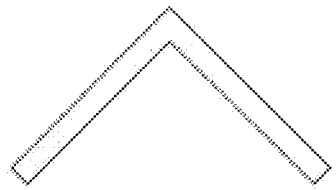
FIGS. 4(a) to (d) illustrate schematically respective examples of defined gap shapes.

The invention will be more clearly understood from the following description, given by way of example only, with reference to the accompanying drawings.

The present invention may be embodied in a wide variety of devices having a similarly wide variety of different shapes and sizes. Such devices are provided with cases within which the functioning components of the device are housed. Also, a variety of user interfaces and connections may be provided in one or more of the walls making up the case.

FIGS. 1(a) and (b) illustrate schematically two respective devices 2 and 4 having a plurality of walls 6, which join at respective boundaries to form the overall case 8.

In the embodiments of FIGS. 1(a) and (b), substantially flat walls 6 are provided. However, it should be appreciated that any number of curved walls may similarly be provided to form a respective case.

In each of the illustrated embodiments, a user interface 10 is provided in one of the walls. The user interface 10 may include a display for providing information to the user regarding the functioning of the device. Alternatively or additionally, the user interface may include inputs, for instance as buttons or on a touch-sensitive screen, allowing a user to control the device.

The illustrated embodiments also include a loudspeaker 12 in one of the walls for providing an output sound wave. In the arrangement of FIG. 1(a), the user interface 10 and loudspeaker 12 are provided in different respective walls, whereas, in the arrangement of FIG. 1(b), the user interface 10 and loudspeaker 12 are provided in the same wall.

It should be appreciated that other embodiments may include only the user interface 10 or only the loudspeaker 12.

It is proposed to provide, in one of the walls 6, an open-sided outwardly facing cavity and to at least partially cover the cavity with a tongue. The cavity and tongue could be provided in any wall 6 of the device, but it may be advantageous to provide them in a wall of the device intended to be positioned at its back or base when in use.

FIG. 2 illustrates schematically a wall 6 of a device including a tongue 20 partially closing a cavity 22.

The illustrated wall 6 is generally planar, but curved walls could also be provided.

The wall 6 has a number of boundaries 14 (four boundaries as illustrated) where it meets with or joins other walls forming the case. The wall 6 extends between those boundaries 14 and extends to an inner peripheral edge 24 defining the edge of the cavity 22.

A surface 26 extends from the inner peripheral edge 24 inwardly of the case and thereby defines the cavity 22. As illustrated, the surface 26 is comprised of four cavity walls 26a and a cavity base 26b. However, it will be appreciated that the surface 26 may be curved such that distinct walls are less evident.

The inner peripheral edge 24 of the wall 6 can be considered to be divided into two portions, namely a first portion 24a along one side of the cavity 22 and a second portion 24b extending along the three further sides of the cavity 22.

As illustrated, the tongue 20 extends from the first portion 24a of the inner peripheral edge 24. In particular, the tongue 20 is provided with a base 20a where the tongue 20 joins with the first portion 24a of the inner peripheral edge 24. The tongue 20 then extends from its base 20a to its own outer peripheral edge 20b.

As illustrated, the outer peripheral edge 20b of the tongue 20 includes three respective sides corresponding to the three respective sides of the second portion 24b of the inner peripheral edge 24 of the wall 6. However, the outer peripheral edge 20b of the tongue 20 may take a variety of different shapes and forms as will be described further below.

As illustrated in FIG. 2, the outer peripheral edge 20b of the tongue 20 and the second portion 24b of the inner peripheral edge 24 of the wall 6 together define a gap providing access to the cavity 22.

FIG. 3 illustrates the tongue 20 moved away from the second portion 24b of the inner peripheral edge so as to open the cavity 22. In this respect, the tongue 20 may be formed of a material that is elastically or plastically deformable. Where the tongue 20 is plastically deformable, in order to again partially close the cavity 22, it is necessary to plastically deform the tongue 20 from the position illustrated in FIG. 3 back to the position illustrated in FIG. 2. Where the tongue 20 is elastically deformable, its own resilience may be provided to return it from the position of FIG. 3 to the position of FIG. 2.

It is also possible for the tongue 20 to be hinged at its base 20A where it meets with the first portion 24A of the inner peripheral edge 24 of the wall 6.

As illustrated in FIG. 3, a number of items 30 of connection may be provided within the cavity 22. As illustrated, the items 30 are located in the base 26b of the surface 26 forming the cavity 22. However, items 30 of connection could be formed at any portion of the surface 26 forming the cavity 22. They may include electrical and optical connectors. They may be used for transferring audio (or video) signals and may be used for connecting to a bus or network. Similarly, a power connection may be provided. The connectors may take the form of sockets for receiving and connecting with associated cables. Alternatively, the connectors may themselves be cables which extend outwardly from the inside of the case.

The cavity provides space (with the tongue in the position of FIG. 2 flush with the wall 6) to house any plugs connected to the respective items of connection 30 in the cavity 22. It is also possible for the cavity 22 to provide space (again with the tongue 20 in the position of FIG. 2) for cables (either integral with or separate but connected to the device) to be stored within the cavity 22.

As explained above, the outer peripheral edge 20b of the tongue 20, together with the second portion 24b of the inner peripheral edge 24 of the wall 6, defines a gap 28. The gap 28 provides access to the inside of the cavity 22. In particular, the gap 28 is arranged to allow one or more cables to extend outwardly from inside the cavity 22.

The shape and path of the outer peripheral edge of the tongue and the second portion of the inner peripheral edge of the wall and, hence, the gap defined therebetween, can take many forms.

FIGS. 4(a) to (d) illustrate edges having straight paths, whereas FIGS. 5(a) to (d) illustrate edges having corresponding curved (and as illustrated circular) paths.

It will be appreciated that mixtures of straight, curved and irregular paths are also possible.

The edges and gap following paths in directions that traverse a variety of angles. In general, the advantage of the edges and gap following paths that traverse a greater angle is that access is available to the cavity from a greater variety of angles.

Figure 5A:
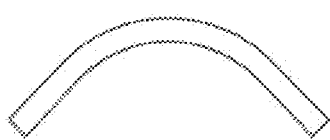
FIGS. 5(a) to (d) illustrate respective examples of defined gap shapes.

FIGS. 4(a) and 5(a) illustrate examples where the end of the paths are 90 degree offset from the start of the paths such that the paths have traversed 90 degrees.

Figure 4B:
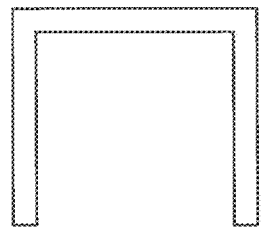
Figure 5B:
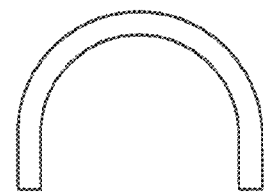
Figure 4C:
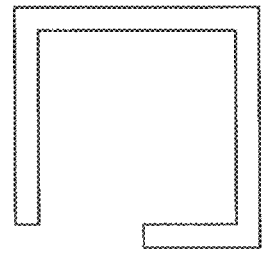
Figure 5C:
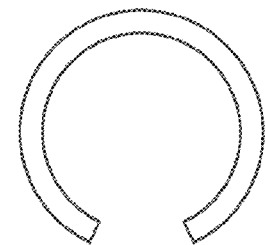
Figure 4D:
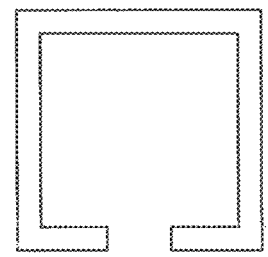
Figure 5D:
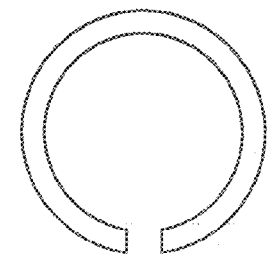

FIGS. 4(b) and 5(b) illustrate paths that have traversed 180 degrees. FIGS. 4(c) and 5(c) illustrate paths that have traversed 270 degrees. FIGS. 4(d) and 5(d) illustrate paths that have traversed 360 degrees.

In the examples described above, the outer peripheral edge of the tongue has followed a path corresponding to the path of the second portion of the inner peripheral edge of the wall. This has the advantage of providing a gap of substantially constant width. In particular, a quadrilateral tongue might be provided with a quadrilateral inner peripheral edge or a circular tongue might be provided with a circular inner peripheral edge.

Figure 6A:
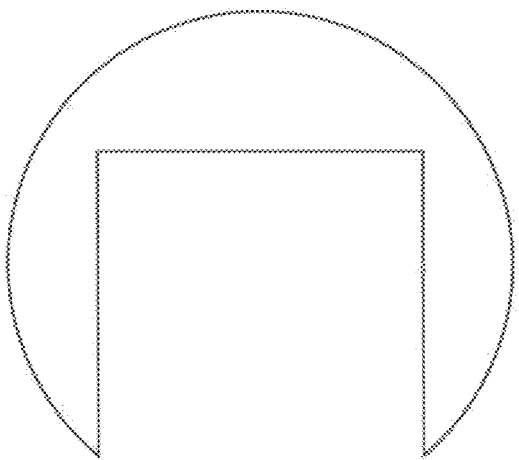
FIGS. 6(a) and (b) illustrate alternative peripheral edge shapes.
Figure 6B:
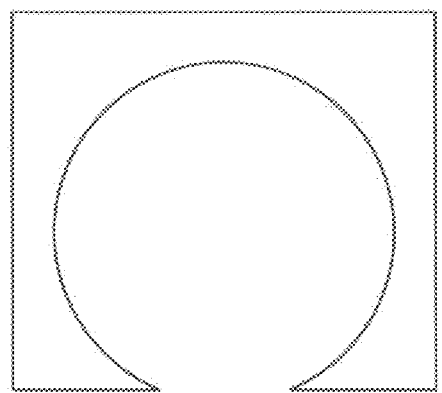

Other arrangements are possible, such as illustrated in FIGS. 6(A) and (B) where, respectively, a quadrilateral tongue is provided with a circular inner peripheral edge and a circular tongue is provided with a quadrilateral inner peripheral edge.

Irrespective of the shape and parts of the inner and outer peripheral edges, the defined gap should be of sufficient width to allow appropriate cables to pass therethrough. The exact minimum width will vary according to the particular type of device and the cables to be used with that device. It is expected that minimum widths might be 3 millimeters, 4 millimeters or 5 millimeters. On the other hand, in order to close the cavity as much as possible, it is desirable that the gap should not be unnecessarily wide. In this respect, it is proposed that the maximum width should be no more than 10 millimeters, 9 millimeters or 8 millimeters.

Figure 7B:
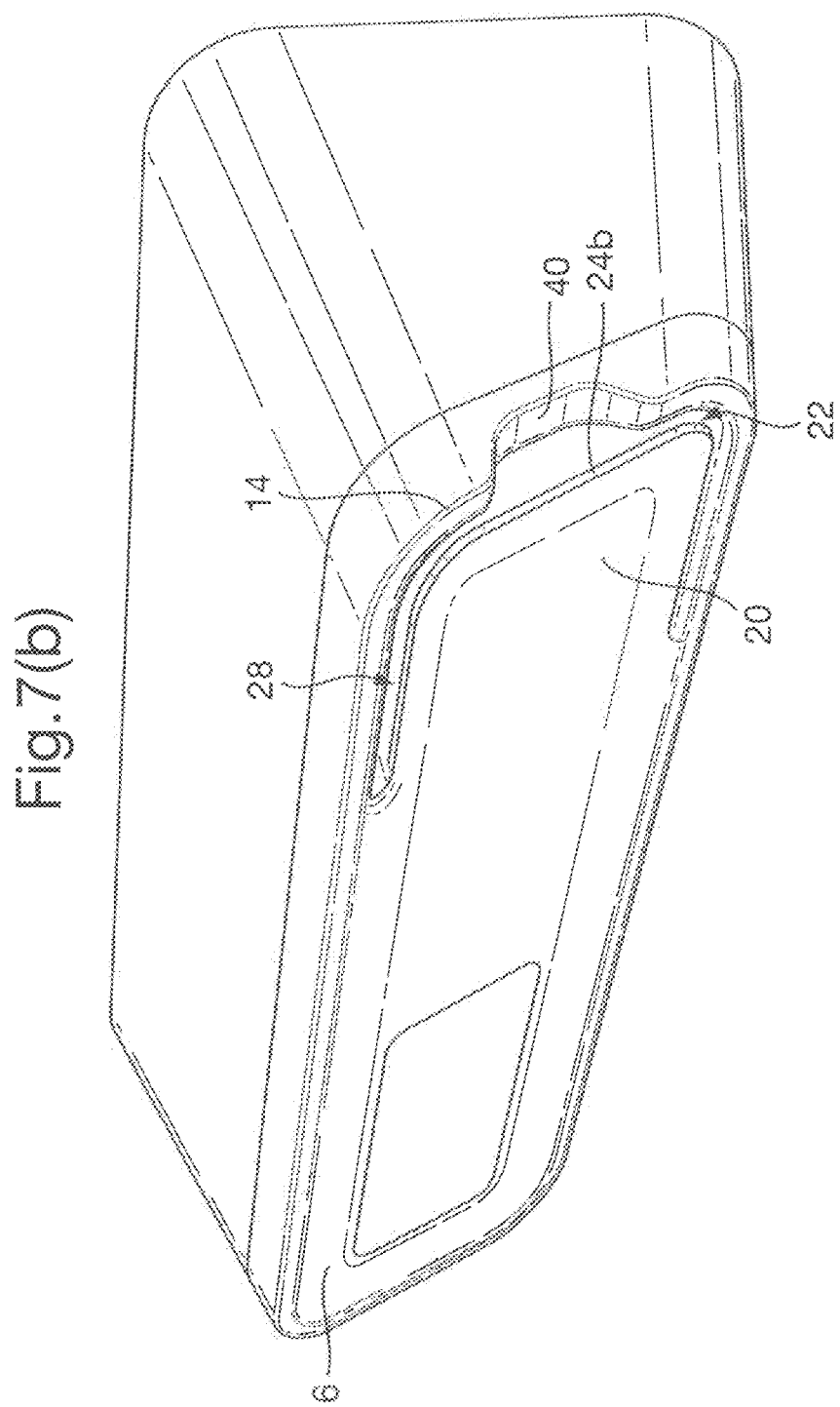
FIGS. 7(a), (b) and (c) illustrate an example of a further device embodying the present invention.

FIGS. 7(a), (b) and (c) illustrate examples of a particular device embodying the present invention and including a further feature, namely a concave surface 40.

In this embodiment, the wall 6 in which the cavity 22 is formed is intended for use as the base of the device.

As illustrated in FIGS. 7(a), (b) and (c), that wall 6 meets, at a boundary 14, with another wall intended for use as a side wall of the device.

The concave surface 40 in the wall 6 extends from the second portion 24b of the inner peripheral edge 24 to the boundary 14. The boundary 14 and the side wall thus similarly define a concave shape where the wall 6 meets the side wall. The concave surface 40 of the wall 6 in this way forms a channel extending from the side wall into the cavity 22 via the gap 28.

With the device positioned as intended with the wall 6 as its base as illustrated in FIG. 7(a), the concave surface 40 at the boundary 14 provides access to the cavity 22. Thus, cables can be run from outside the device to the cavity 22 without interfering with how the device sits on its wall 6 as a base.

It should be appreciated that other similar concave surfaces can be provided to the same boundary 14 and same side wall. Additionally or alternatively, concave surfaces could be provided to other boundaries and other side walls. This allows access for cabling to the cavity 22 in different directions.

Figure 8A:
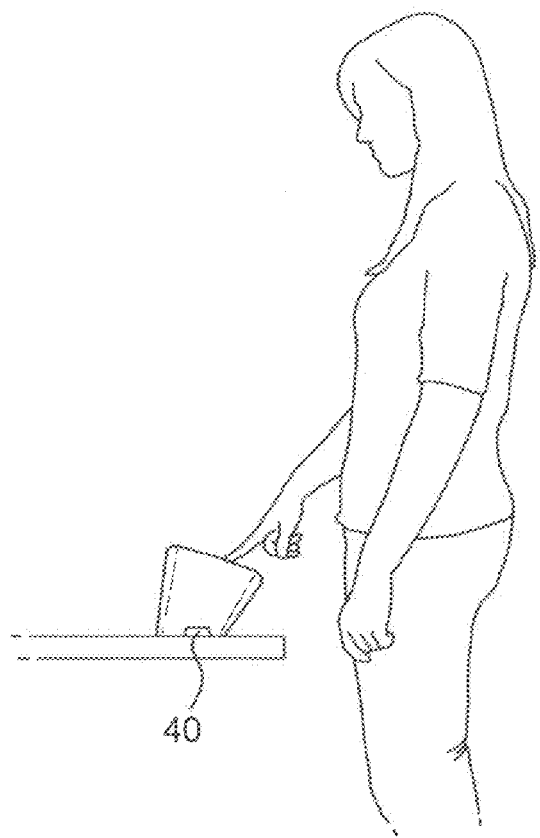
FIGS. 8(a) and (b) illustrate schematically alternative respective orientations for the device.
Figure 8B:
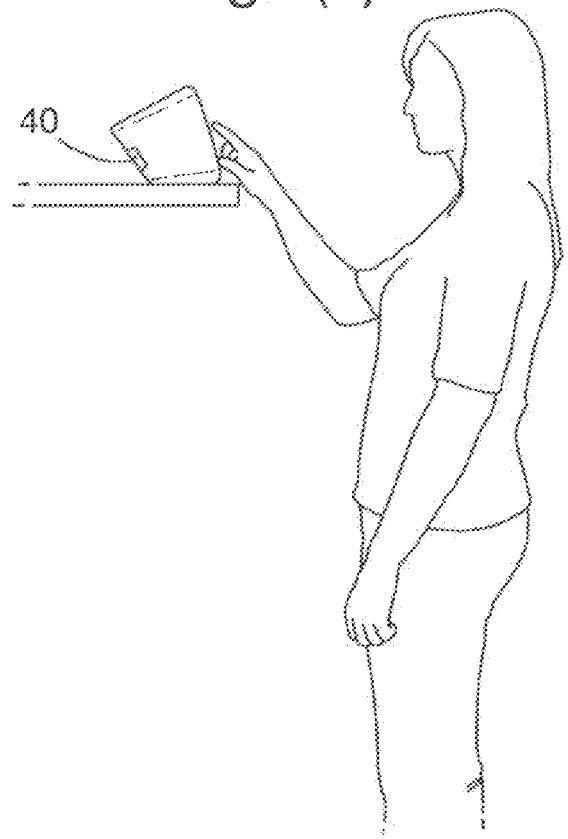

FIG. 8(a) illustrates schematically the device resting with wall 6 horizontal as its base. FIG. 8(b) illustrates schematically an alternative orientation of the same device with wall 6 substantially vertical at the rear of the device.

We claim:

1. An audio/video device including:
   a plurality of walls together forming a case, wherein one wall of the plurality of walls includes an inner peripheral edge;
   a surface extending from the inner peripheral edge inwardly of the case and defining an open-sided outwardly facing cavity;
   at least one item of connection located within the cavity; and
   a tongue having a base and an outer peripheral edge, wherein the inner peripheral edge of the one wall is divided into a first portion and a second portion,
   at the base, the tongue joins with the first portion of the inner peripheral edge of the one wall,
   the tongue extends substantially parallel with the one wall from the base to the outer peripheral edge so as to partially close the cavity and define a gap around the tongue, the gap extending between the outer peripheral edge of the tongue and the second portion of the inner peripheral edge of the one wall, and
   the tongue is movable away from and back towards the second portion of the inner peripheral edge of the one wall so as respectively to open and close the cavity.

2. An audio/video device according to claim 1, wherein the tongue includes a hinge joining the base to the inner peripheral edge of the one wall.

3. An audio/video device according to claim 1, wherein the tongue is flexible and is able to flex by one of elastic and plastic deformation.

4. An audio/video device according to claim 1, wherein the tongue and the cavity together define a space arranged to store at least one cable.

5. An audio/video device according to claim 1, wherein the at least one item of connection includes one or more of: an electrical audio socket, an optical audio socket, an aerial socket, a network socket, a bus socket, and a power socket.

6. An audio/video device according to claim 1, wherein the at least one item of connection includes at least one cable extending outwardly from inside the case.

7. An audio/video device according to claim 1 wherein the one wall of the plurality of walls meets another wall of the plurality of walls at a boundary and the one wall of the plurality of walls includes a concave surface extending from said second portion of the inner peripheral edge to the boundary so as to define a channel along which a cable can run from the another wall to the cavity.

8. An audio/video device according to claim 1, wherein the gap extending between the outer peripheral edge of the tongue and the second portion of the inner peripheral edge of the one wall is arranged to support at least one cable extending therethrough.

9. An audio/video device according to claim 1, wherein the width of the gap between the outer peripheral edge of the tongue and the second portion of the inner peripheral edge of the one wall is at least 3 millimeters.

10. An audio/video device according to any preceding claim, wherein at least one of the inner peripheral edge of the one wall and the tongue is one of substantially quadrilateral and substantially circular.

11. An audio/video device according to claim 1 wherein the gap, the outer peripheral edge of the tongue and the second portion of the inner peripheral edge of the one wall follow respective paths which together traverse one of at least 90 degrees, at least 180 degrees, at least 270 degrees and at least 360 degrees.

12. An audio/video device according to claim 1 further including, inside the case, components for reproducing audio information.

13. An audio/video device according to claim 1 further including a user interface on one of said plurality of walls, optionally opposite said one wall.

14. An audio/video device according to claim 1 configured as an interne radio.

15. A method of housing items of connection in an audio/video device having a plurality of walls, together forming a case, the method including:
   forming an inner peripheral edge in one wall of the plurality of walls and providing a surface extending from the inner peripheral edge inwardly of the case so as to form an open-sided outwardly facing cavity;
   providing at least one item of connection within the cavity; and
   using a tongue to partially close the cavity by providing the tongue with a base and an outer peripheral edge, by joining the base with a first portion of the inner peripheral edge, the inner peripheral edge being divided into a first portion and a second portion, and by providing the tongue to extend parallel with the one wall from the base to the outer peripheral portion and to define a gap around the tongue, the gap extending between the outer peripheral edge of the tongue and the second portion of the inner peripheral edge of the one wall, wherein
   the tongue is movable away from and back towards the second portion of the inner peripheral edge of the one wall so as respectively to open and close the cavity.

16. An audio/video device according to claim 1, wherein the width of the gap between the outer peripheral edge of the tongue and the second portion of the inner peripheral edge of the one wall is at least 4 millimeters.

17. An audio/video device according to claim 1, wherein the width of the gap between the outer peripheral edge of the tongue and the second portion of the inner peripheral edge of the one wall is at least 5 millimeters.

18. An audio/video device according to claim 1, wherein the width of the gap between the outer peripheral edge of the tongue and the second portion of the inner peripheral edge of the one wall is less than 10 millimeters.

19. An audio/video device according to claim 1, wherein the width of the gap between the outer peripheral edge of the tongue and the second portion of the inner peripheral edge of the one wall is less than 9 millimeters.

20. An audio/video device according to claim 1, wherein the width of the gap between the outer peripheral edge of the tongue and the second portion of the inner peripheral edge of the one wall is less than 8 millimeters.

\* \* \* \* \*